United States Patent [19]
Okada et al.

[11] 3,986,051
[45] Oct. 12, 1976

[54] SIGNAL SWITCHING APPARATUS

[75] Inventors: Takashi Okada, Yamato; Kimitake Utsunomiya, Tokyo, both of Japan

[73] Assignee: Sony Corporation, Tokyo, Japan

[22] Filed: Oct. 9, 1974

[21] Appl. No.: 513,386

[30] Foreign Application Priority Data
Oct. 11, 1973 Japan.............................. 48-114225

[52] U.S. Cl............................... 307/254; 307/237; 307/296
[51] Int. Cl.² ........................................ H03K 17/00
[58] Field of Search ............ 307/254, 255, 238, 237, 307/296

[56] References Cited
UNITED STATES PATENTS

| | | | |
|---|---|---|---|
| 3,657,577 | 4/1972 | Wakai et al.......................... | 307/237 |
| 3,660,679 | 5/1972 | Ishigaki et al....................... | 307/254 |
| 3,869,623 | 3/1975 | Minner ................................ | 307/254 |

Primary Examiner—Stanley D. Miller, Jr.
Assistant Examiner—B. P. Davis
Attorney, Agent, or Firm—Lewis H. Eslinger; Alvin Sinderbrand

[57] ABSTRACT

Signal switching apparatus is disclosed whereby a selected one of a plurality of supplied input signals is switched to an output terminal, including a switching circuit having plural input terminals for receiving the input signals and an output terminal to which a selected one of the received input signals is supplied; a control circuit coupled to the switching circuit and responsive to a control signal applied thereto for selectively actuating the switching circuit to thereby enable the switching circuit to supply one of the input signals to its output terminal; a clamping circuit coupled to the switching circuit and responsive to the control circuit for inhibiting the switching circuit from supplying more than one selected input signal to the output terminal; and an input signal supply circuit for supplying the plural input signals to the input terminals of the switching circuit.

14 Claims, 3 Drawing Figures

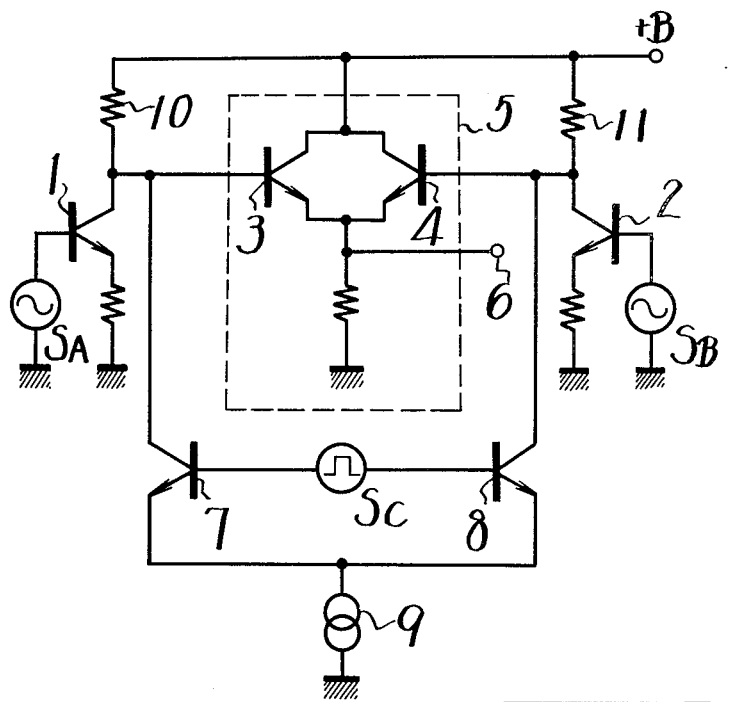
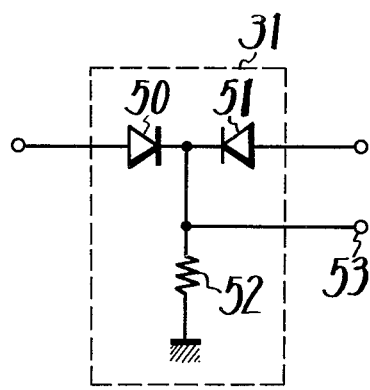
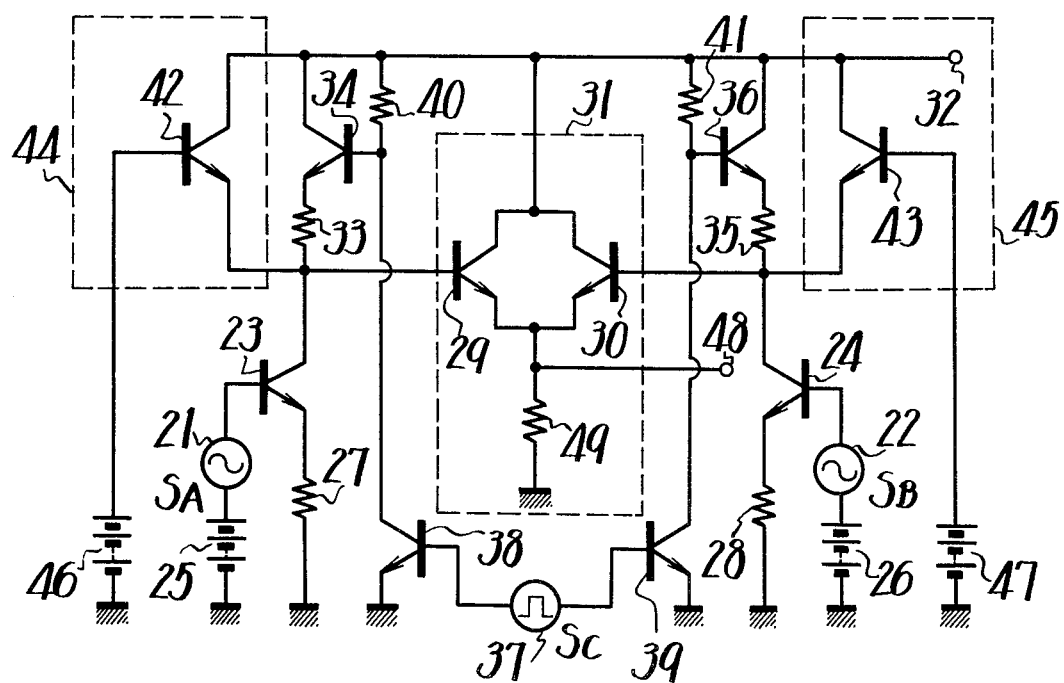

SIGNAL SWITCHING APPARATUS

BACKGROUND OF THE INVENTION

This invention relates to electronic switching apparatus and, more particularly, to electronic switching apparatus wherein a clamping circuit is provided to insure that only a desired input signal is switched to an output terminal as determined by a control signal applied to the apparatus.

Prior art electronic switching circuits are known whereby one of a plurality of input signals is switched to an output terminal in accordance with a particular characteristic of a control signal applied to the circuit. Such switching circuits are advantageous to, for example, control the switching of analog information signals as well as digital or binary signals that might be used therewith. A typical one of such prior art switching circuits which is operated to select one of two input signals to be switched to an output terminal is comprised of a pair of switching transistors having their respective collector-emitter circuits connected in parallel and their respective base electrodes connected to receive the respective input signals supplied to the circuit. These transistors are adapted for emitter-follower operation and the circuit output terminal generally is connected to the common-connected emitters. Control transistors are connected to the respective base electrodes of the switching transistors so as to determine which of the switching transistors is to be conductive, thereby determining which of the supplied input signals is switched to the circuit output terminal.

In the aforedescribed prior art electronic switching circuit one of the control transistors is driven into saturation while the other is rendered non-conductive. The interconnections between the respective control transistors and the base electrodes of the respective switching transistors is such that when a control transistor is driven into saturation, the bias potential supplied thereby to the base electrode of an associated switching transistor is sufficiently lowered to thereby dispose the switching transistor in its nonconductive state. Consequently, an input signal supplied to the non-conducting switching transistor would be inhibited from being coupled therethrough to the output terminal. Now, if the other control transistor is rendered non-conductive, the interconnections between this control transistor and the base electrode of the associated switching transistor is such that the bias potential supplied to that base electrode is of sufficient magnitude to drive that switching transistor to its conducting state. Consequently, an input signal supplied to this conducting switching transistor is coupled thereby to the circuit output terminal. The operation of the respective control transistors is determined by the particular control signal supplied thereto, whereby the particular input signal that is switched to the output terminal by this prior art switching circuit can be reversed merely by suitably changing the characteristics of the control signal.

It is, of course, desirable to produce electronic switching circuits in integrated circuit configuration. However, it has been found that, when the aforedescribed prior art electronic switching circuit is constructed as an integrated circuit, the stray capacitances that are inherent between the respective electrodes of the control transistors as well as the stray capacitances between the transistor electrodes and circuit ground produce a filtering effect such that when the switching circuit is operated, the frequency response characteristic of that circuit is deleteriously affected as a direct function of such a filtering effect.

A further disadvantage in such prior art switching circuits resides in that the switching transistor which is provided with a bias potential of sufficient magnitude to render the switching transistor non-conductive can be driven to its conducting state if the input signal supplied thereto admits of a large amplitude. In that event, an undesired input signal is switched to the circuit output terminal, resulting in erroneous operation of the switching circuit and substantially obfuscating the results obtained by further apparatus.

OBJECTS OF THE INVENTION

Therefore, it is an object of the present invention to provide an improved signal switching apparatus that overcomes the problems found in prior art devices.

It is another object of the present invention to provide an improved signal switching apparatus having a superior frequency response characteristic which is not deteriorated during operation of the apparatus.

A still further object of this invention is to provide an improved signal switching apparatus that is readily adapted to be constructed in integrated circuit configuration.

Yet another object of the present invention is to provide an improved signal switching apparatus wherein leakage of an input signal to the output terminal is avoided.

Another object of this invention is to provide signal switching apparatus including a clamping circuit which insures that the undesired coupling of an input signal to the output terminal by a selectively deactuated switching device is avoided.

Various other objects and advantages of this invention will become apparent from the ensuing detailed description, and the novel features will be particularly pointed out in the appended claims.

SUMMARY OF THE INVENTION

An electronic switching circuit for selectively switching a selected one of a plurality of input signals to an output terminal is comprised of a plurality of switching elements, each adapted to receive an input signal and to selectively supply the received input signal to an output terminal; a control circuit coupled to the switching elements and responsive to a control signal applied thereto for selectively actuating a particular one of such switching elements and to thereby deactuate the remaining switching elements; and a clamping circuit coupled to the switching elements and responsive to the control circuit for inhibiting all of the deactuated switching elements from coupling the input signals respectively applied thereto to the output terminal.

BRIEF DESCRIPTION OF THE DRAWINGS

The following detailed description will best be understood in conjunction with the accompanying drawings in which:

FIG. 1 is a schematic diagram of a typical prior art switching circuit;

FIG. 2 is a schematic diagram of a particular one of the preferred embodiments of the present invention; and FIG. 3 is a schematic diagram of an alternative embodiment of switching elements which find ready application in the present invention.

DETAILED DESCRIPTION OF A CERTAIN ONE OF THE PREFERRED EMBODIMENTS

Referring now to the drawings and, in particular, to FIG. 1, a typical prior art electronic switching circuit is schematically represented. The illustrated circuit is adapted to selectively switch either of two input signals supplied thereto to an output terminal in accordance with predetermined characteristics of a control signal. As shown, the switching circuit is comprised of input signal supply transistors 1 and 2, switching transistors 3 and 4 and control transistors 7 and 8. The signal supply transistors 1 and 2 are adapted to be supplied with respective input signals, depicted as signal sources $S_A$ and $S_B$, respectively, connected to the base electrodes of the supply transistors. The collector electrode of the transistor 1 is connected to the base electrode of the switching transistor 3 and, additionally, to a source of operating potential +B through a collector load resistor 10. The supply transistor 2 is similarly connected whereby the collector electrode thereof is connected to the base electrode of the switching transistor 4 and, additionally, to the source of operating potential +B through a collector load resistor 11.

Each of the switching transistors 3 and 4 is connected in emitter-follower configuration such that the respective emitter electrodes thereof are connected to a circuit output terminal 6 and, additionally, through an emitter load resistor to a reference potential, such as ground. The collector electrodes of the respective switching transistors 3 and 4 are connected in common to the source of operating potential +B.

The conductivity of the respective switching transistors is determined by the bias potential appearing at their respective base electrodes. This bias potential is controlled by the respective control transistors 7 and 8 which are symmetrically connected to the base electrodes of the switching transistors and which are adapted to receive a control signal represented by a control signal source $S_C$. In particular, the collector electrode of the control transistor 7 is directly connected to the base electrode of the switching transistor 3 and the emitter electrode of the control transistor is connected through a current source 9 to ground. Similarly, the collector electrode of the control transistor 8 is directly connected to the base electrode of the switching transistor 4 and the emitter electrode of the control transistor is connected through the current source 9 to ground. The control signals supplied to the respective base electrodes of the control transistors 7 and 8 by the control signal source $S_C$ are of opposite polarities and are typically pulse signals. Thus, when a pulse of sufficient magnitude and appropriate polarity is supplied to the control transistor 7 so as to drive that transistor into its saturation state, a pulse of either opposite polarity or of substantially zero magnitude is supplied to the control transistor 8.

Briefly, in operation, if the signal supplied by the source $S_A$ is to be switched to the output terminal 6, the control signal supplied by the control signal source $S_C$ to the base electrodes of the control transistors 7 and 8, respectively, are such that the transistor 7 is rendered nonconductive and the transistor 8 is driven into saturation. Accordingly, current flows from the source of operating potential +B through the collector load resistor 11, through the saturated control transistor 8 and through the current source 9 to ground. As a consequence thereof, the bias potential supplied to the base electrode of the switching transistor 4 is greatly reduced so as to render that switching transistor non-conductive. However, as the control transistor 7 is effectively turned off by the control signal supplied thereto, the bias potential supplied to the base electrode of the switching transistor 3 is of sufficient magnitude to render that transistor conductive. Consequently, the input signal supplied to the transistor 1 by the signal source $S_A$ is coupled from the collected electrode of the transistor 1 to the output terminal 6 by the conducting switching transistor 3. Thus, although the input signal supplied by the source $S_A$ is switched to the output terminal, the input signal supplied by the source $S_B$ is effectively blocked from being coupled through to the output terminal. Of course, if the operation of the switching circuit is to be reversed to thereby enable the input signal supplied by the source $S_B$ to be coupled to the output terminal 6, the control signals supplied by the source $S_C$ are reversed. Furthermore, if both of the control transistors are driven to their saturated conditions, the bias potentials supplied to the base electrodes of the switching transistors 3 and 4, respectively, are sufficiently reduced to render the respective switching transistors non-conductive. In that event, neither of the input signals will be coupled to the output terminal 6.

It has, unfortunately, been found that sufficient stray capacitance exists between the respective collector electrodes of the transistors 7 and 8 and ground, and between the respective collector and base electrodes and between the respective collector and emitter electrodes of the transistors. As noted hereinabove, such stray capacitance functions as a filter with respect to the input signals, thereby deteriorating the frequency response characteristics of the prior art switching circuit. Moreover, even if, for example, the transistor 8 is saturated such that the bias potential appearing at the base electrode of the switching transistor 4 is greatly reduced so as to render the switching transistor non-conductive, the input signal supplied by the source $S_B$, if of sufficient magnitude, can forward bias the base and collector electrodes of the transistor 2 so as to force the transistor 4 to turn on. Consequently, undesired leakage of the input signal to the output terminal 6 is present. Such leakage between the input signal supplied by the source $S_A$ and the output terminal 6 can obtain in a similar fashion.

The problems inherent in prior art switching circuits of the type depicted in FIG. 1 are avoided in accordance with the present invention, one preferred embodiment thereof being illustrated in FIG. 2. As shown, the switching circuit is comprised of a switching device 31, clamping circuits 44 and 45 and control circuits for selectively determining the conductivity of the switching circuit and the energization of the clamping circuits. More particularly, the switching device 31 is comprised of a plurality of semiconductor elements, here illustrated as transistors 29 and 30, each being adapted to selectively conduct an input signal supplied thereto to an output terminal 48. Although only two switching transistors are shown, it should be appreciated that any number of such switching transistors can be employed to selectively couple any one of a plurality of input signals to the output terminal. The collector-emitter circuits of the respective switching transistors are connected in parallel relation, whereby the common-connected collector electrodes are coupled to a source of energizing potential 32 and the common-connected emitter electrodes are coupled through an emitter resistor 49 to a reference potential, such as ground and, additionally, to the output terminal 48. As is appreciated, the switching transistors are connected in emitter-follower configuration, and each of the base electrodes is adapted to receive an input signal supplied thereto. As is further appreciated, an input signal supplied to the base electrode of a switching transistor is coupled therethrough to the output terminal 48 only if that switching transistor is biased to its conducting state. If none of the switching transistors is so biased, none of the input signals is transmitted to the output terminal. However, and as will soon become apparent, when one of the switching transistors is rendered conductive and the remaining switching transistors are effectively turned off, the input signal supplied to the corresponding conducting transistor will be transmitted therethrough to the output terminal 48, whereas the remaining input signals supplied to the non-conducting transistors will be inhibited from being coupled to the output terminal.

A plurality of signal supply transistors, equal in number to the number of switching transistors, are coupled to the respective base electrodes of such switching transistors. The signal supply transistors are adapted to supply the respective switching transistors with a corresponding input signal, as may be applied to the signal supply transistors. In the interest of simplification, only two such signal supply transistors 23 and 24 are illustrated. Transistors 23 and 24 are similar in that the respective input signals $S_A$ and $S_B$ are supplied to their base electrodes, as depicted by the signal supply sources 21 and 22. In addition, respective DC bias potentials are provided at the base electrodes of the transistors 23 and 24 by conventional biasing networks, here shown as DC supply sources 25 and 26, respectively. The collector electrodes of the transistors 23 and 24 are connected to the base electrodes of the switching transistors 29 and 30, respectively. The emitter electrodes of the transistors 23 and 24 are coupled to ground by emitter resistors 27 and 28, respectively. Suitable operating potential is supplied to the transistors 23 and 24 by respective series circuits, each including a transistor collector-emitter circuit and a series-connected resistor. In particular, a transistor 34, included in a first control circuit, includes a collector electrode connected to the source of operating potential 32 and an emitter electrode connected through a resistor 33 to the collector electrode of the transistor 23. Similarly, a transistor 36, included in a second control circuit, includes a collector electrode connected to the source of operating potential 32 and an emitter electrode connected through a resistor 35 to the collector electrode of the transistor 24.

The respective control circuits are further comprised of transistors 38 and 39, each of which is adapted to receive a control signal $S_C$ supplied to its base electrode by a suitable source 37 of control signals. The control signals produced by the source 37 are preferably of opposite polarity such that one of the transistors 38, 39 is rendered conductive in response thereto while the other of these transistors is rendered non-conductive. It should be appreciated that, if more than two transistors are coupled to the source 37, only one of such transistors will be rendered conductive while the remaining transistors are non-conductive. As shown, the collector electrode of the transistor 38 is connected through a load resistor 40 to the source of operating potential 32 and, additionally, to the base electrode of the transistor 34. The emitter electrode of the transistor 38 is connected to ground. The transistor 39 is connected in an analogous manner such that the collector electrode thereof is connected through a load resistor 41 to the source of operating potential 32 and, additionally, to the base electrode of the transistor 36. The emitter electrode of the transistor 39 is connected to ground. As will soon become apparent, the conductivity of the respective transistors 34 and 36 is determined by the conducting state of the transistors 38 and 39, respectively, which respond to the control signals supplied by the source 37. In particular, the transistors 34 and 36 are adapted to supply DC bias potentials, the magnitude of which is determinative of the actuation of the switching transistors 29 and 30. The transistors 38 and 39 function as control transistors and respond to the control signals $S_C$ to determine the particular magnitude of the DC bias potential which is provided by the transistors 34 and 36, respectively.

The clamping circuits 44 and 45 are similar in that each is adapted to supply a clamping potential to the base electrodes of the switching transistors 29 and 30, respectively, to insure that a switching transistor, when deactuated, remains in its non-conducting state. The energization of the respective clamping circuits is a function of the DC bias potential produced by the aforedescribed transistors 34 and 36. Accordingly, the clamping circuit 44 is comprised of a transistor 42 having its collector electrode connected to the source of energizing potential 32 and its emitter electrode connected to the base electrode of the switching transistor 29. As is recognized, the emitter electrode of the transistor 42 is thus connected to the junction defined by the collector electrode of the transistor 23 and the resistor 33. Consequently, the emitter electrode of the transistor 42 is adapted to receive the DC bias potential supplied by the transistor 34. A clamping bias voltage source 46, adapted to supply a DC voltage, is connected to the base electrode of the transistor 42.

The clamping circuit 45 is comprised of a transistor 43 which is connected in an analogous manner as the connection of the transistor 42, described above. Accordingly, the collector electrode of the transistor 43 is connected to the source of operating potential 32 and the emitter electrode of the transistor is connected to the base electrode of the switching transistor 30 and thus to the junction defined by the collector electrode of the transistor 24 and the resistor 35. Accordingly, the emitter electrode of the transistor 43 is adapted to receive the DC bias potential produced by the transistor 36. A clamping bias voltage source 47 is connected to the base electrode of the transistor 43. It should be apparent that, although two clamping circuits 44 and 45 are illustrated herein, the number of clamping circuits provided should be equal to the number of semiconductor elements included in the switching device 31.

The operation of the switching circuit illustrated in FIG. 2 will now be described. Let it be assumed that the signal $S_B$ supplied by the illustrated signal source 22 is to be coupled to the output terminal 48. It is thus preferred to impede the transmission of the signal $S_A$ to the output terminal so as to avoid any interference in the output signal derived from the switching circuit. Accordingly, the control signals $S_C$ provided by the source 37 are such that the transistor 38 is rendered conductive and the transistor 39 is simultaneously disposed in its non-conductive state. for example, the control signals supplied to the respective base electrodes of the transistors 38 and 39 are pulse signals wherein a positive pulse of relatively high potential is applied to the base electrode of the transistor 38 whereas the base electrode of the transistor 39 is supplied with a potential having magnitude and/or polarity that is insufficient to "turn on" that transistor. When the transistor 38 is conducting, current flows from the source of operating potential 32 through the resistor 40 and through the collector-emitter circuit of the transistor 38 to ground. Consequently, the potential appearing at the collector electrode of the transistor 38 is significantly reduced to thereby lower the potential at the base electrode of the transistor 34.

Prior to the conduction of the transistor 38, the transistor 34 had been "turned on" so that a relatively high bias potential had been supplied to the base electrode of the transistor 29 by the emitter circuit of the transistor 34. However, now that the potential supplied to the base electrode of the transistor 34 by the transistor 38 is reduced, the transistor 34 is rendered non-conductive. Consequently, current no longer flows through the collector-emitter circuit thereof and the bias potential supplied to the base electrode of the transistor 29 decreases. When such bias potential is reduced below the potential level necessary to sustain conduction, the transistor 29 is "turned off". Thus, the signal $S_A$ which might be coupled to the base electrode thereof will not be transmitted to the output terminal 48.

In addition, as the bias potential supplied by the emitter circuit of the transistor 34 to the base electrode of the transistor 29 is reduced, it is recognized that the bias potential applied to the emitter electrode of the transistor 42 is identically reduced. Since the base electrode of the transistor 42 is supplied with a substantially constant DC voltage, it is appreciated that the base-emitter bias of the transistor 42 is increased. When the bias potential supplied by the emitter circuit of the transistor 34 is reduced to a sufficient level whereby the transistor 29 is no longer conductive, that level is also sufficient to energize the transistor 42 such that a conducting path extends through the base-emitter circuit thereof. If the DC voltage supplied to the transistor 42 by the clamping bias voltage source 46 is represented as $V_c$, and if the base-emitter voltage drop across the transistor 42 is represented by $V_{be}$ then the clamping potential supplied by the energized transistor 42 to the base electrode of the transistor 29 is equal to $V_c - V_{be}$. This clamping potential is effective to maintain the deactuated transistor 29 in its non-conductive state to thereby prevent any signal supplied to the base electrode of the transistor 29 from being transmitted to the output terminal 48.

It should thus be recognized that, even if the signal $S_A$ supplied to the transistor 23 by the source 21 is amplified by that transistor, whereby a signal of large amplitude is supplied to the collector electrode of the transistor 23, the energized transistor 42 serves to by-pass this signal. Consequently, the transistor 29 is not undesirably driven into its conducting state, as was true for the prior art circuit depicted in FIG. 1. Hence, even if an input signal is provided with large amplitude, the clamping circuit 44 serves to preclude the leakage of such input signal to the output terminal 48 when the transistor 29 is "turned off".

It is recalled that the control signal applied to the base electrode of the transistor 39 by the source 37 is of a magnitude and/or polarity that is not sufficient to render the transistor conductive. Accordingly, the transistor 39 is "turned off" so that current does not flow therethrough. Consequently, a relatively high potential is supplied from the source of operating potential 32 to the base electrode of the transistor 36, causing that transistor to be conductive. When the transistor 36 conducts, current flows through the collector-emitter circuit thereof and through the resistor 35 to supply a relatively high bias potential to the base electrode of the transistor 30 and, additionally, to the emitter electrode of the transistor 43.

The transistor 30 is "turned on" in response to the bias potential now supplied to the base electrode thereof by the emitter circuit of the transistor 36. Consequently, the input signal $S_B$ supplied by the source 22 and coupled to the base electrode of the transistor 30 by the transistor 24 is now transmitted through the base-emitter circuit of the transistor 30 to the output terminal 48. At this time, the base-emitter bias of the transistor 43, which is a function of the bias potential supplied to the emitter electrode thereof by the transistor 36, is not sufficient to actuate the transistor 43. That is, the difference between the DC voltage supplied by the source 47 and the bias potential supplied by the emitter circuit of the transistor 36 is not greater than the necessary threshold level required to "turn on" the transistor 43. Hence, the clamping circuit 45 is de-energized.

In the preferred embodiment illustrated in FIG. 2, the filtering effect attributed to stray capacitance is substantially reduced in comparison to the filtering effects inherent in the prior art circuit of FIG. 1. This obtains because the input signal $S_B$ which is coupled through to the output terminal 48 is affected only by the stray capacitance between the base and emitter electrodes of the transistor 43. Similarly, when the input signal $S_A$ is coupled through to the output terminal 48, it is affected only by the stray capacitance between the base and emitter electrodes of the transistor 42. Accordingly, the frequency response characteristic of the illustrated switching circuit is not significantly deteriorated.

Now, if it is desired to switch the input signal $S_A$ to the output terminal 48 and to inhibit the input signal $S_B$ from being transmitted thereto, the control signals $S_C$ supplied to the respective base electrodes of the transistors 38 and 39 are reversed. That is, the transistor 39 is provided with a control signal of positive polarity and sufficient magnitude to render the transistor conductive. This control signal may, of course, be a pulse-type signal. Simultaneously, the transistor 38 is rendered non-conductive by the control signal supplied thereto. Now, in this mode of operation, the transistor 36 is rendered non-conductive to supply a relatively low bias potential to the base electrode of the transistor 30 and to the emitter electrode of the transistor 43. Conversely, since the transistor 38 is now non-conductive, the transistor 34 is "turned on" to supply a relatively high bias potential to the base electrode of the transistor 29 and to the emitter electrode of the transistor 42. Consequently, the transistor 29 is actuated and the clamping circuit 44 is de-energized. Also, the transistor 30 is deactuated and the clamping circuit 45 is energized. As a result thereof, the input signal $S_A$ is transmitted through the transistor 23 and through the conducting transistor 29 to the output terminal 48. However, since the transistor 30 is deactuated and, additionally, since the base electrode thereof is supplied with a clamping potential, the input signal $S_B$ supplied through the transistor 24 cannot be transmitted by the transistor 30 to the output terminal.

Although the foregoing has suggested that the transistors 38 and 39 are mutually exclusively responsive to the control signals $S_C$ such that only one of the transistors 38 and 39 is "turned on" at a given time, it should be readily appreciated that both of these transistors can be rendered non-conductive simultaneously. That is, if the control signals $S_C$ supplied to the base electrodes of these transistors are not sufficient to "turn on" either one, then both transistors 34 and 36 will be conductive so as to supply a relatively high bias potential to the base electrodes of the transistors 29 and 30, respectively, and to the emitter electrodes of the transistors 42 and 43, respectively. In this mode of operation, both semiconductor elements of the switching device 31 are deactuated and both of the clamping circuits 44 and 45 are energized. Hence, neither the input signal $S_A$ nor the input signal $S_B$ can be transmitted to the output terminal 48. Furthermore, by reason of the respective clamping circuits, leakage of the input signals to the output terminal is precluded.

A further embodiment of the switching device 31 is illustrated in FIG. 3. As shown, the respective transistors 29 and 30 can be replaced by semiconductor diodes 50 and 51 having their respective cathode electrodes connected in common to an output terminal 53 and their respective anode electrodes connected to receive the input signals, the DC bias potentials and the clamping potentials, previously described in FIG. 2. As further illustrated in FIG. 3, the common-connected cathode electrodes of the diodes 50 and 51 are connected to ground by a load resistor 52. The alternative embodiment of the switching device 31 cooperates with the bias supply and clamping circuitry of FIG. 2 in a manner analogous to that of the transistors 29 and 30. Therefore, in the interest of brevity, further description of the operation of the alternative embodiment of the switching device will not be provided.

While the invention has been particularly shown and described with reference to a certain preferred embodiment thereof, it will be obvious to those of ordinary skill in the art that the present invention admits of various alternative modifications and changes. For example, the illustrated switching circuit can be used to switch any number of input signals to an output terminal, provided that a corresponding number of elements included in the switching device 31 is provided. A like number of bias supply circuits and clamping circuits should also be provided to accomodate the plurality of input signals. Thus, the switching circuit in accordance with the present invention can be used to selectively switch input signals, such as analog information signals (e.g. video signals, audio signals and the like) or digital signals to an output terminal in accordance with the selective application of control signals to the circuit. It is intended that the appended claims be interpreted as including the foregoing and various other changes and modifications in form and details which do not depart from the spirit and scope of the invention.

What is claimed is:

1. Apparatus for selectively switching to an output terminal a supplied input signal, comprising:
   an amplifier comprising an input circuit to receive said input signal and an output circuit from which a reproduction of said input signal is available;
   switch means having an input terminal connected to said output circuit for receiving said input signal and for supplying said input signal to an output terminal thereof when actuated;
   clamp means coupled to the output circuit of said amplifier and the input terminal of said switch means for simultaneously inhibiting said amplifier and switch means from transmitting said input signal through to said output terminal;
   control means coupled to both said switch means and said clamp means and responsive to a control signal selectively applied thereto for deactuating said switch means and for controlling said clamp means to maintain the deactuation of said switch means; and
   input signal supply means for supplying said input signal to said amplifier means.

2. Apparatus in accordance with claim 1 wherein said switch means comprises a semiconductor element admitting of a conducting state whereby said input signal is supplied to said output terminal, and a non-conducting state; the respective state of said semiconductor element being determined by a DC bias potential applied thereto.

3. Apparatus in accordance with claim 2 wherein said control means comprises:
   bias supply means for supplying a first DC bias potential to said semiconductor element and to said clamp means for rendering said semiconductor element conductive; and
   a control transistor coupled to said bias supply means and responsive to said control signal for selectively enabling said bias supply means to supply said first DC bias potential and disabling said bias supply means to thereby supply a second DC bias potential, said second DC bias potential rendering said semiconductor element non-conductive and energizing said clamp means.

4. Apparatus for selectively switching to an output terminal a supplied input signal, comprising:
   switch means comprising a semiconductor element having an input terminal for receiving said input signal and for supplying said input signal to an output terminal thereof when in a conducting state;
   control means coupled to said switch means and responsive to a control signal selectively applied thereto for supplying a first DC bias potential to render said semiconductor element conductive and for supplying a second DC bias potential to render said semiconductor element non-conductive;
   input signal supply means for supplying said input signal to said switch means; and
   clamp means comprising a clamping transistor coupled to said control means and energizable in response to said second DC bias potential applied thereto to supply a clamping potential to said semiconductor element, said clamping potential maintaining said semiconductor element in said nonconducting state.

5. Apparatus for selectively switching to an output terminal a supplied input signal, comprising switch means including a first transistor having a base electrode for receiving a first DC bias potential whereby said first transistor is rendered conductive and a second DC bias potential whereby said first transistor is rendered nonconductive, said base electrode additionally receiving said input signal; clamp means including a second transistor for supplying a clamping potential to said first transistor base electrode, said clamping potential maintaining said first transistor non-conductive; control means including a third transistor responsive to a control signal applied thereto for selectively supplying said first DC bias potential to both said first and second transistors, whereby said first transistor is rendered conductive and said second transistor is de-energized, and said second DC bias potential to both said first and second transistors, whereby said first transistor is rendered non-conductive and said second transistor is energized to supply said clamping potential to said first transistor base electrode; an output terminal coupled to said first transistor; and input signal supply means for supplying said input signal to said first transistor base electrode.

6. Apparatus for switching to an output terminal a selected one of a plurality of supplied input signals comprising:

a plurality of amplifiers, each comprising an input circuit to receive a respective one of said input signals and each comprising an output circuit from which a reproduction of the respective signal is available;

switch means having plural input terminals each conto a respective one of said output circuits for receiving said respective reproduction signal and for selectively supplying said reproduction signal to an output terminal thereof when actuated;

control means coupled to each of said output circuits and the respective one of said switch means and responsive to control signals applied thereto for selectively actuating and deactuating said amplifiers and switch means to thereby enable said switch means not deactuated to supply reproductions of selected ones of said input signals to said output terminal;

clamping means coupled to said switch means and said amplifiers and responsive to said control means for selectively inhibiting said amplifiers and said switch means from supplying to said output erminal a signal other than said one input signal; and input signal supply means for supplying said plural input signals to said plural input terminals of said amplifier means.

7. Apparatus in accordance with claim 6 wherein said switch means comprises a plurality of semiconductor means each coupled to an associated one of said plural input terminals; each of said semiconductor means admitting of a conducting state whereby said input signal applied to an associated input terminal is supplied to said output terminal, and a non-conducting state; the respective state of each of said semiconductor means being determined by a DC bias potential applied thereto.

8. Apparatus in accordance with claim 7 wherein said control means comprises:

a plurality of DC bias supply means each coupled to an associated one of said semiconductor means and each being responsive to a control signal applied thereto for producing a corresponding DC bias potential; and means for selectively supplying a control signal to a selected one of said DC bias supply means to thereby determine the respective DC bias potentials produced by all of said DC bias supply means.

9. Apparatus for switching to an output terminal a selected one of a plurality of supplied input signals comprising:

switch means having plural input terminals for receiving said input signals and for selectively supplying a respective one of said input signals to an output terminal thereof when actuated; said switch means comprises a plurality of semiconductor means each coupled to an associated one of said plural input terminals; each of said semiconductor means admitting of a conducting state whereby said input signal applied to an associated input terminal is supplied to said output terminal, and a non-conducting state; the respective state of each of said semiconductor means being determined by a DC bias potential applied thereto;

a plurality of DC bias supply means each coupled to an associated one of said semiconductor means and each being responsive to a control signal applied thereto for producing a corresponding DC bias potential;

means for selectively supplying a control signal to a selected one of said DC bias supply means, said control signal supply means including means for supplying a first control signal to said selected one DC bias supply means and a second control signal to the others of said DC bias supply means, whereby said selected one DC bias supply means produces a DC bias potential of predetermined magnitude to thereby dispose said associated semiconductor means in its conducting state and said others of said DC bias supply means produce DC bias potentials of magnitude to thereby dispose the remaining semiconductor means in their respective non-conducting states;

clamping means coupled to said switch means and responsive to a DC bias potential for inhibiting said switch means from supplying to said output terminal an input signal other than said one input signal; and input signal supply means for supplying said plural input signals to said plural input terminals of said switch means.

10. Apparatus for switching to an output terminal a selected one of a plurality of supplied input signals comprising:

switch means having plural input terminals for receiving said input signals and for selectively supplying a respective one of said input signals to an output terminal thereof when actuated; said switch means including a plurality of semiconductor means each coupled to an associated one of said plural input terminals; each of said semiconductor means admitting of a conducting state whereby said input signal applied to an associated input terminal is supplied to said output terminal, and a non-conducting state; the respective state of each of said semiconductor means being determined by a DC bias potential applied thereto;

control means coupled to said switch means and responsive to a control signal applied thereto for selectively actuating and deactuating said switch means to thereby enable said switch means to supply one of said input signals to said output terminal;

clamp means for inhibiting said switch means from supplying to said output terminal an input signal other than said one input signal, said clamp means including a plurality of clamping potential supply means each coupled to an associated one of said semiconductor means and each being operable by a DC bias potential applied thereto in response to said control signal to thereby supply a clamping potential to said associated semiconductor means, said clamping potential being of predetermined magnitude to maintain said associated semiconductor means in its non-conducting state regardless of the magnitude of the input signal applied thereto; and input signal supply means for supplying said plural input signals to said plural input terminals of said switch means.

11. Apparatus in accordance with claim 10 wherein said control means comprises a plurality of DC bias supply means each being coupled to an associated one of said clamping potential supply means and each being responsive to a control signal applied thereto for producing a corresponding DC bias potential; said DC bias potential admitting of a first magnitude to operate an associated clamping potential supply means whereby a clamping potential is supplied to said associated semiconductor means, and a second magnitude whereby said associated clamping potential supply means is not operated.

12. Apparatus for switching to an output terminal a selected one of a plurality of supplied input signals, comprising switch means including a first pair of transistors having their respective collector-emitter circuits connected in parallel and their respective base electrodes connected to receive a first DC bias potential selectively applied thereto to render one of said transistors conductive and a second DC bias potential selectively applied thereto to render the other of said transistors non-conductive; said respective base electrodes additionally receiving respective input signals; clamp means including a second pair of transistors for selectively supplying clamping potentials to the base electrodes of said first pair of transistors, the clamping potential selectively supplied being of magnitude to maintain the transistor to which it is supplied non-conductive; control means including a third pair of transistors mutually exclusively responsive to said control signal such that one of said third pair of transistors selectively supplies said first DC bias potential to the base electrode of a respective one of said first pair of transistors and to a respective one of said second pair of transistors, whereby said one of said first pair of transistors is rendered conductive and said one of said second pair of transistors is de-energized, and the other of said third pair of transistors selectively supplies said second DC bias potential to the base electrode of the other of said first pair of transistors and to the other of said second pair of transistors, whereby said other of said first pair of transistors is rendered nonconductive and said other of said second pair of transistors is energized to supply said clamping potential to said base electrode of said other of said first pair of transistors; and input signal supply means for supplying input signals to the respective base electrodes of said first pair of transistors.

13. Apparatus for switching to an output terminal a selected one of a plurality of supplied input signals comprising:

switch means having plural input terminals for receiving said input signals and for selectively supplying a respective one of said input signals to an output terminal thereof when actuated; said switch means comprises a plurality of transistors having their respective collector-emitter circuits connected in parallel and their respective base electrodes supplied with said input signals, each transistor coupled to an associated one of said plural input terminals and admitting of a conducting state whereby said input signal applied to an associated input terminal is supplied to said output terminal, and a non-conducting state; the respective state of each transistor being determined by a DC bias potential applied thereto;

control means coupled to said switch means and responsive to a control signal applied thereto for selectively actuating and deactuating said switch means to thereby enable said switch means to supply one of said input signals to said output terminal;

clamping means coupled to said switch means and responsive to said control means for inhibiting said switch means from supplying to said output terminal an input signal other than said one input signal; and input signal supply means for supplying said plural input signals to said plural input terminals of said switch means.

14. Apparatus for switching to an output terminal a selected one of a plurality of supplied input signals comprising:

switch means having plural input terminals for receiving said input signals and for selectively supplying a respective one of said input signals to an output terminal thereof when actuated; said switch means comprises a plurality of diodes having first electrodes connected in common to an output terminal and second electrodes respectively supplied with said input signals, each diode coupled to an associated one of said plural input terminals, and admitting of a conducting state whereby said input signal applied to an associated input terminal is supplied to said output terminal, and a nonconducting state; the respective state of each diode being determined by a DC bias potential applied thereto;

control means coupled to said switch means and responsive to a control signal applied thereto for selectively actuating and deactuating said switch means to thereby enable said switch means to supply one of said input signals to said output terminal;

clamping means coupled to said switch means and responsive to said control means for inhibiting said switch means from supplying to said output terminal an input signal other than said one input signal; and input signal supply means for supplying said plural input signals to said plural input terminals of said switch means.

* * * * *